United States Patent [19]

Yamamoto et al.

[11] Patent Number: 5,335,413
[45] Date of Patent: Aug. 9, 1994

[54] CONNECTOR TERMINAL INSPECTION DEVICE AND INSPECTION METHOD

[75] Inventors: Hiroshi Yamamoto; Hitoshi Sakai, both of Shizuoka, Japan

[73] Assignee: Yazaki Corporation, Tokyo, Japan

[21] Appl. No.: 96,989

[22] Filed: Jul. 27, 1993

[30] Foreign Application Priority Data

Jul. 27, 1992 [JP] Japan ................... 4-199610

[51] Int. Cl.⁵ ............................................. G01R 31/04
[52] U.S. Cl. .................................... 29/593; 324/538
[58] Field of Search ............... 29/593, 857; 439/488; 324/158 F, 158 P

[56] References Cited

U.S. PATENT DOCUMENTS

| | | |
|---|---|---|
| 4,902,968 | 2/1990 | Sugimoto . |
| 5,157,830 | 10/1992 | Koeh ................................ 29/857 |
| 5,165,161 | 11/1992 | Cerguone et al. ............... 29/593 |

FOREIGN PATENT DOCUMENTS

| | | |
|---|---|---|
| 55-8221 | 2/1980 | Japan . |
| 57-56216 | 12/1982 | Japan . |
| 2-5383 | 1/1990 | Japan . |

Primary Examiner—Carl J. Arbes
Attorney, Agent, or Firm—Sughrue, Mion, Zinn, Macpeak & Seas

[57] ABSTRACT

A support for a connector to be inspected and an inspection device body are disposed to be freely movable with respect to a base, connector engaging pins which go into the connector to be inspected are fixed to the base side within the support, and a plurality of inspection pins are arranged in a row in the inspection device body with their respective leading ends projected. For inspection, the inspection pins are moved backward as contacted with the terminal fitting of the connector to be inspected to pass electricity through a circuit in the inspection device body and the connector engaging pins work to detect the terminal fitting in the incompletely inserted state and move the incompletely inserted terminal fitting into the completely inserted position as the connector is moved. By constructing as described above, the incompletely inserted terminal fitting is detected when inspecting conductivity of the connector terminal fitting, and the incompletely inserted terminal fitting is forced to move into the completely inserted state, thereby making it possible to prevent the terminal fitting from coming off.

24 Claims, 7 Drawing Sheets

FIG. I
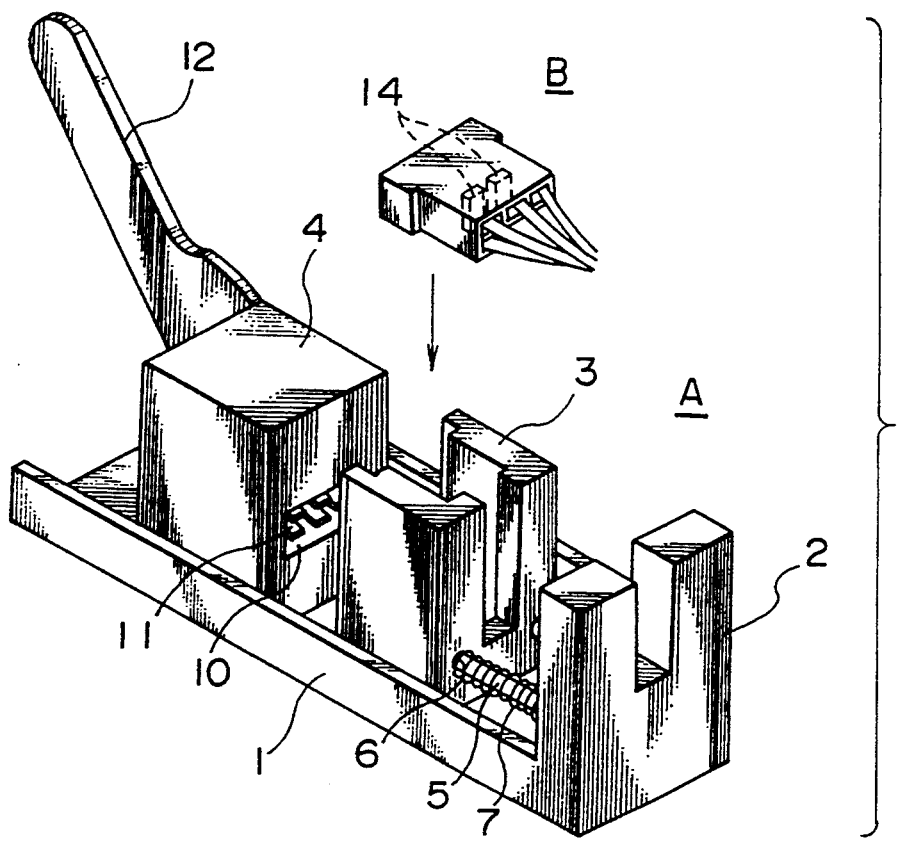
FIG. 2
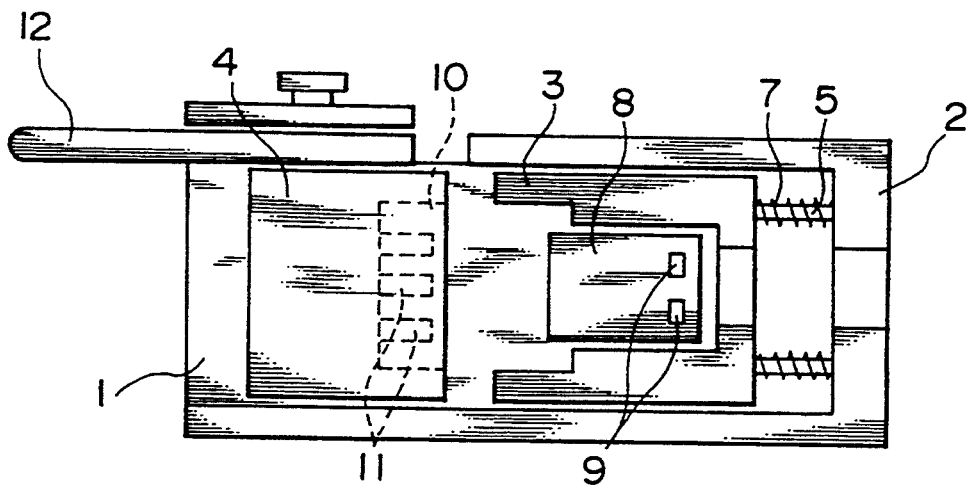

CONNECTOR TERMINAL INSPECTION DEVICE AND INSPECTION METHOD

FIELD OF THE INVENTION

This invention relates to a terminal inspection device for connectors used between wire harnesses in automobiles and between electrical equipments and to a terminal inspection method.

BACKGROUND OF THE INVENTION

A connector generally has a structure that a female or male terminal is housed in a terminal housing chamber of a connector housing and the terminal is stopped by a terminal lance or case lance method to prevent falling off, and completes electrical connection between both terminals by fitting female and male connectors. When a connector is used, falling off of a terminal due to tensile force applied to a connected electric wire or defective conductivity has to be prevented.

In view of the above, Japanese Utility Model Publication No. 8221/1980 discloses a connector terminal inspection device for multipolar connectors having a plurality of terminal fittings housed and stopped, in which a plurality of inspection pins corresponding to each terminal fitting of the above multipolar connector are disposed in a row in an inspection device body and the leading end of each inspection pin is projected by means of a spring, so that the inspection pins which move backward by contacting with the terminal fitting when the inspection device body is advanced for inspection allows electricity to flow a circuit within the inspection device body.

In the above prior art, however, since the inspection pins also contact with the terminal fitting which is not completely inserted to pass electricity through the circuit, it is impossible to detect an incompletely inserted terminal fitting according to the above conductivity inspection.

SUMMARY OF THE INVENTION

The connector terminal inspection device and inspection method of this invention aim to prevent a terminal fitting of a connector from coming off by detecting a terminal fitting which is not completely inserted during the inspection of conductivity of the terminal fitting and by forcing the above incompletely inserted terminal fitting into a completely inserted state.

In the connector terminal inspection device of this invention, a support for a connector to be inspected and an inspection device body are disposed to be freely movable with respect to a base, connector engaging pins which go into the connector to be inspected is fixed to the base side within the support, and a plurality of inspection pins are arranged in a row in the inspection device body with their respective leading ends projected. For inspection, the inspection pins move backward as contacted with the terminal fitting of the connector to be inspected to pass electricity through a circuit in the inspection device body and the connector engaging pins work to move the terminal fitting in the incompletely inserted state into the completely inserted position as the connector is moved.

Furthermore, in the connector terminal inspection device of this invention, the support for the connector to be inspected is fixed to the base and the inspection device body is disposed to be freely movable. And, the connector engaging pins which move into the connector to be inspected are provided in the support and a plurality of inspection pins are arranged in a row in the inspection device body with their respective leading ends projected. The connector engaging pins detect an incompletely inserted terminal fitting when the connector is fitted into the support for inspection, the terminal fitting is moved into a completely inserted state in the process that the connector engaging pins move into the connector, and the inspection device body is shifted to make the inspection pins to contact with the terminal fitting which is completely inserted in the connector and to move backward, thereby passing electricity through the circuit within the inspection device body.

The connector terminal inspection method of this invention disposes a support for a connector to be inspected and an inspection device body to be freely movable with respect to a base, fixes connector engaging pins which go into the connector to be inspected to the base side within the connector support, disposes a plurality of inspection pins in a row within the inspection device body with their respective leading ends projected, fits the connector to be inspected into the connector support, moves the connector engaging pins into the connector, shifts the inspection device body so as to move the connector support and the connector to be inspected, contacts the inspection pins with the terminal fitting of the connector to move backward so as to pass electricity through the circuit within the inspection device body, and moves the terminal fitting in the incompletely inserted position into a completely inserted position by the connector engaging pins.

In addition, the connector terminal inspection method of this invention fixes the support for the connector to be inspected to the base, disposes the inspection device body to be freely movable, disposes the connector engaging pins which move into the connector to be inspected in the support, disposes a plurality of inspection pins in a row in the inspection device body, judges whether the connector engaging pins may move into the connector to be inspected when the connector is fitted into the connector support, if positive, moves the inspection device body to contact the inspection pins with the terminal fitting of the connector and to move the inspection pins backward so as to pass electricity through the circuit within the inspection device body, if negative, detects the presence of a terminal fitting which is not completely inserted, advances the terminal fitting of the connector into a completely inserted position by the connector engaging pins as the connector engaging pins move into the connector, and moves the inspection device proper to contact the inspection pins with the terminal fitting of the connector and to move backward, thereby passing electricity through the circuit within the inspection device body.

BRIEF DESCRIPTION OF THE DRAWINGS

FIG. 1 is a perspective view of the inspection device and the connector to be inspected in Example 1 of this invention.

FIG. 2 is a plan view showing the inspection device of Example 1 of this invention.

DETAILED DESCRIPTION OF THE INVENTION

Figure 3:
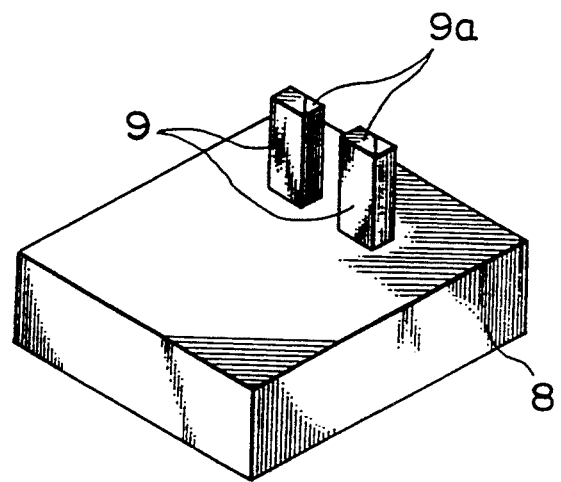
FIG. 3 is a perspective view showing part of the connector support of the inspection device in Example 1 of this invention.

In the connector terminal inspection device of this invention, a support for a connector to be inspected and an inspection device body are disposed to be freely movable with respect to a base, the support is also energized by means of a spring in the direction of the inspection device body, connector engaging pins which move into the connector to be inspected are fixed on the base side in the support, and a plurality of inspection pins are disposed in a row in the inspection device body with their respective leading ends projected. For inspection, there is employed a construction that the support and the connector to be inspected are moved by the movement of the inspection device body and the inspection pins move backward as contacted with the terminal fitting of the connector to pass electricity through a circuit in the inspection device body and the connector engaging pins work to move the terminal fitting in the incompletely inserted state into the completely inserted position as the connector is moved.

In the above construction, the leading ends of the connector engaging pins are possibly formed to have a tapered shape, so that the connector engaging pins can smoothly move the incompletely inserted terminal fitting into the completely inserted position as the connector moves.

Furthermore, in the connector terminal inspection device of this invention, the support for the connector to be inspected is fixed to the base, the inspection device body is disposed to be freely movable, the connector engaging pins which move into the connector to be inspected are provided in the support, and a plurality of inspection pins are arranged in a row in the inspection device body with their respective leading ends projected. Construction employed includes that the connector engaging pins detect incompletely inserted terminal fitting when a connector to be inspected is fitted into the support for inspection, and the movement of the inspection device body allows the inspection pins to contact with the terminal fitting which is fixed to be completely inserted into the connector and to move backward, thereby passing electricity through the circuit within the inspection device body.

In this case, when the connector to be inspected is fitted into the support, the connector engaging pins can detect the incompletely inserted terminal fitting.

In addition to the above, in the connector terminal inspection device of this invention, the support for a connector to be inspected is fixed to the base, the inspection device body is disposed to be freely movable, a plurality of inspection pins are disposed in a row within the inspection device body with their leading ends projected, the connector engaging pins are disposed within the support to move into the connector to be inspected, the leading ends of the connector engaging pins are formed in a tapered shape and the connector terminal fitting has tapered engaging shoulders formed integrally with an electrical contact section at the rear end of the electrical contact section. When the connector to be inspected is fitted into the support for the inspection, the tapered leading ends of the connector engaging pins contact with the tapered engaging shoulders of the terminal fitting, the incompletely inserted terminal fitting is advanced to a completely inserted position in the process that the engaging pins are moved, and the movement of the inspection device body causes the inspection pins to contact with the connector terminal fitting and to move backward, thereby passing electricity through the circuit within the inspection device body.

In this case, the connector engaging pins can move the incompletely inserted terminal fitting into a completely inserted state when the connector terminal fitting is to be inspected.

The connector terminal inspection method of this invention is characterized by disposing a support for a connector to be inspected and an inspection device body to be freely movable with respect to a base, having the connector support energized in the direction of the inspection device body by means of a spring, fixing connector engaging pins which go into the connector to be inspected to the base side within the connector support, disposing a plurality of inspection pins in a row within the inspection device body with their respective leading ends projected, advancing the connector engaging pins into the connector when fitting the connector into the connector support, moving the inspection device body under that state to move the connector support which is energized in the direction of the inspection device body by the spring and the connector to be inspected and to contact the inspection pins with the terminal fitting of the connector to move them backward so as to pass electricity through the circuit within the inspection device body, and moving the terminal fitting in the incompletely inserted position into a completely inserted position by the connector engaging pins in the process of moving the connector.

The above connector inspection method of this invention may consists of forming receiving holes in the connector housing to receive the connector engaging pins, positioning the connector engaging pins at the rear of the receiving holes when the connector to be inspected is fitted into the connector support, then moving the inspection device body to move the connector support which is energized in the direction of the inspection device body by the spring and the connector to be inspected and to contact the inspection pins with the terminal fitting of the connector to move them backward so as to pass electricity through the circuit within the inspection device body, relatively moving the connector engaging pins to the front position of the receiving holes in the process of moving the connector, and moving the incompletely inserted terminal fitting into the completely inserted position by the relative movement of the connector engaging pins from the rear to front sections of the receiving holes.

Furthermore, the connector terminal inspection method of this invention is characterized by fixing the support for a connector to be inspected to the base, disposing the inspection device body to be freely movable, disposing the connector engaging pins within the connector support to move into the connector to be inspected, disposing a plurality of inspection pins in a row within the inspection device body with their leading ends projected, judging whether the connector engaging pins can move into the connector to be inspected when the connector is fitted into the connector support, if the connector engaging pins can be moved into the connector, moving the inspection device body to contact the inspection pins with the terminal fitting of the connector and to move the inspection pins backward under that state so as to pass electricity through the circuit within the inspection device body, and if the connector engaging pins cannot move into the connector, thereby detecting the presence of a terminal fitting which is not completely inserted.

In addition, the connector terminal inspection method of this invention is characterized by fixing the support for a connector to be inspected to the base, disposing the inspection device body to be freely movable with respect to the base, disposing the connector engaging pins within the connector support to move into the connector to be inspected, disposing a plurality of inspection pins in a row within the inspection device body with their leading ends projected, fitting the connector into the connector support and also moving the connector engaging pins into the connector, advancing the terminal fitting in the connector to the completely inserted position by means of the connector engaging pins in the above moving process, moving the inspection device body to contact the inspection pins with the connector terminal fitting and to move the inspection pins backward, thereby passing electricity through the circuit within the inspection device body.

In the aforementioned each connector inspection method, a plurality of terminal accommodating chambers can be disposed in a row within a connector housing of the connector to receive the terminal fitting, and connector engaging pin receiving holes can be formed between the adjacent terminal accommodating chambers.

And, in the aforementioned each connector inspection method, a plurality of terminal accommodating chambers are arranged in N rows in the horizontal direction and in multiple steps in the vertical direction within the connector housing for the connector, and the connector engaging pin receiving holes can be formed in the number of (N−1) through from the bottom of the connector housing for the connector to the terminal accommodating chambers and ranging over the adjacent terminal accommodating chambers.

Furthermore, in the aforementioned each connector inspection method, the leading ends of the connector engaging pins are formed in a tapered shape, and the connector terminal fitting received in the connector has tapered engaging shoulders formed integrally with an electrical contact section at the rear end of the electrical contact section, so that the tapered leading ends can be contacted with the tapered engaging shoulders.

The invention is now illustrated in greater detail with reference to the following examples and embodiments, but the present invention is not to be construed as being limited thereto.

EXAMPLE 1

FIG. 1 and FIG. 2 show the inspection device in one example of this invention. In FIG. 1, a stationary wall 2 is erected at one end of a base 1 of a terminal inspection device A, a connector support 3 whose top and front and rear are open is disposed at the middle to be movable in the back and forth directions, and an inspection device body 4 is disposed at the other end to be movable in the back and forth directions. To the stationary wall 2, a movement guide rod 5 is fixed, which is extended into a through hole 6 of the connector support 3, and a spring 7 is wound on the movement guide rod 5 to energize the connector support 3 in the direction to the inspection device body 4. Within the connector support 3, a connector receiver 8 shown in FIG. 3 is fixed, and two connector engaging pins are erected on the connector receiver 8. The connector engaging pins 9 have tapered leading ends 9a to make the engagement with a terminal fitting easier. At the front of the inspection device body 4, a connector receiving port 10 is formed in which a plurality of inspection pins are projected. The inspection pins are disposed to correspond to terminal fittings of a connector to be inspected and structured to be energized forward by a spring and moved backward to flow electricity through a circuit within the inspection device body 4. The inspection device body 4 is moved back and forth by the pivotal movement of an operation lever 12 disposed at one side.

Figure 4:
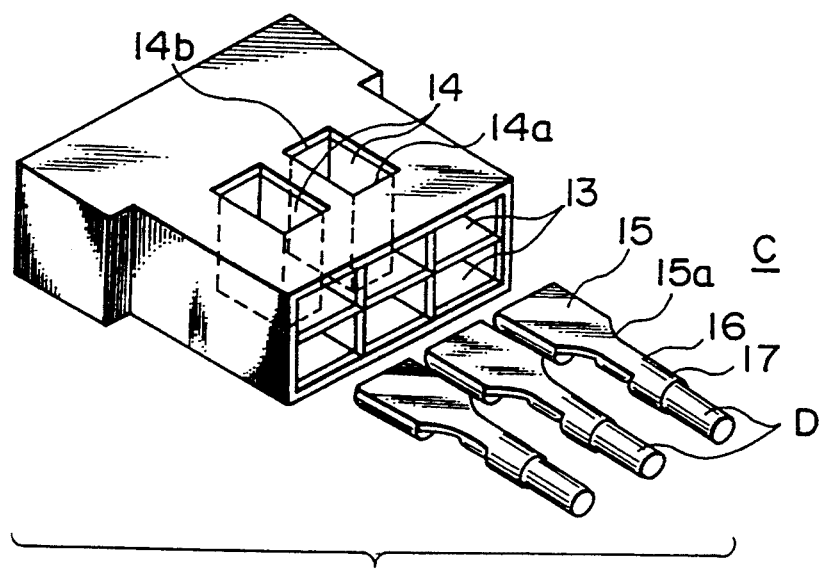
FIG. 4 is a perspective view showing the connector housing and terminal fittings in Example 1 of this invention.
Figure 5A:
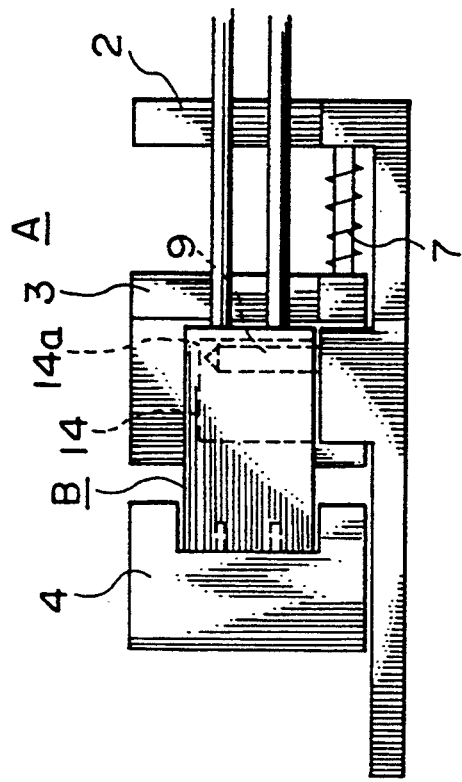
FIGS. 5A-5D includes side views showing the inspection process in Example 1 of this invention.
Figure 5C:
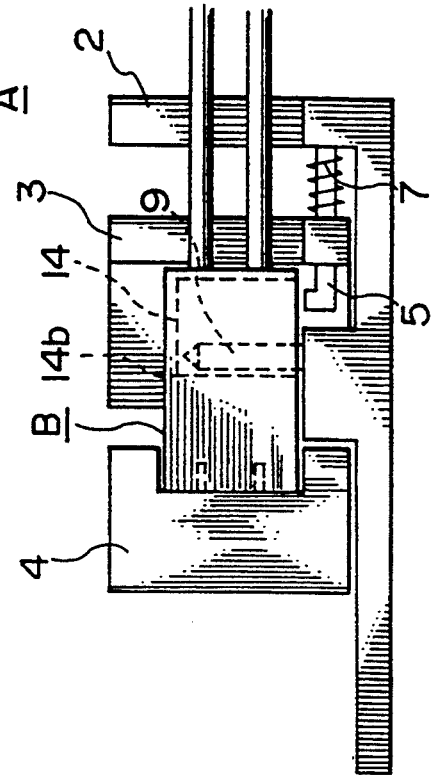
Figure 5B:
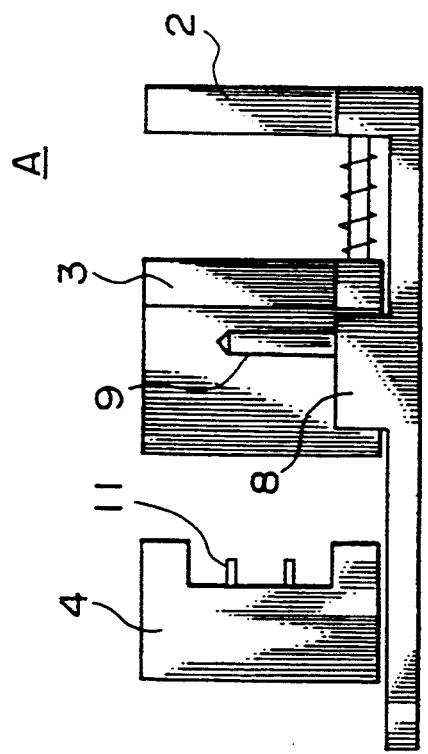
Figure 5D:
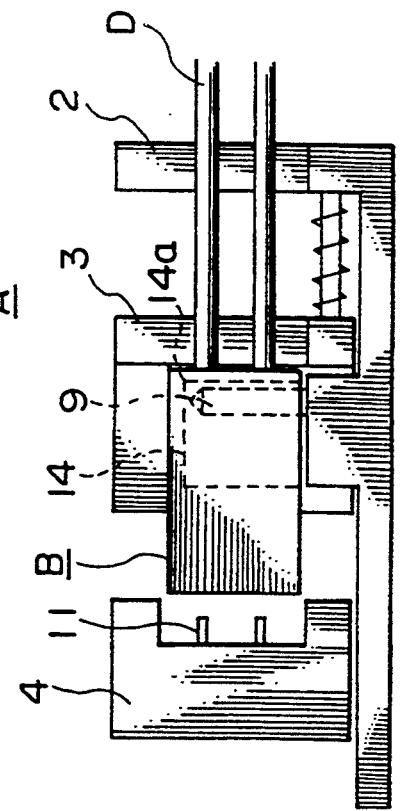

FIG. 4 shows a connector to be inspected used in this example. A connector housing B1 has six terminal accommodating chambers 13 which are arranged in three rows wide and two steps vertical and two connector engaging pin receiving holes 14 which range from the bottom to the top of the terminal accommodating chambers 13. Terminal fittings C have electric contacts 17 connected in series to female electric contacts 15 through middle connectors 16 and have tapered engaging shoulders 15a formed at the rear ends of the female electric contacts 15.

FIG. 5 includes side views showing the inspection device A which is under inspecting process. The inspection device is in the state (i) at the start of inspection, then a connector B which has terminal fittings connected to electric wires D inserted into its terminal accommodating chambers is fit into the connector support 3 from the above as shown in (ii), and the connector engaging pins 9 are moved into rear sections 14a of the connector engaging pin receiving holes 14. When the operation lever is pivoted under this state, the inspection device body 4 advances to contact with the connector B as shown in (iii), and when the operation lever is further pivoted, the inspection device body 4 and the connector support 3 move to the right side in the drawing against the spring 7 as shown in (iv) and the connector engaging pins 9 are positioned at the front sections 14b of the connector engaging pin receiving holes 14. At this time, the inspection pins 11 are forced to contact with the terminal fittings and moved backward to pass electricity through the circuit within the inspection device body 4.

Figure 6A:
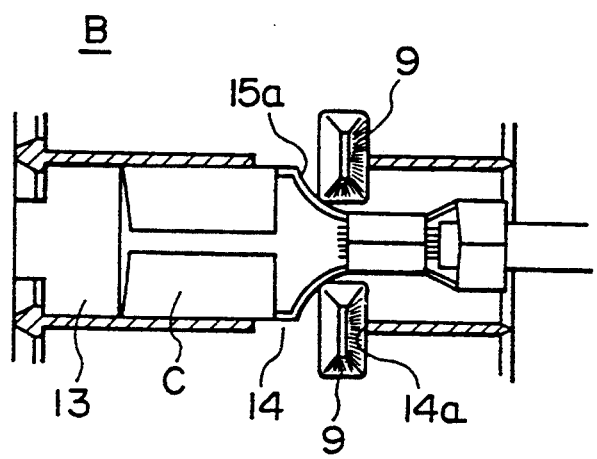
FIGS. 6A-6B includes plan views showing the relation between the connector engaging pins and the terminal fitting in Example 1 of this invention.
Figure 6B:
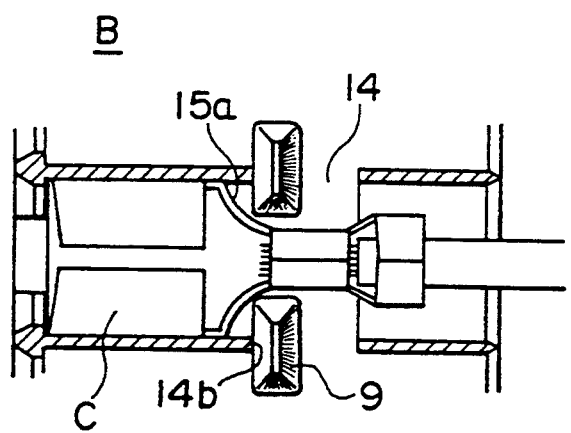

FIG. 6 includes plan views showing the positions of a terminal fitting within one terminal accommodating chamber of the connector housing. If the terminal fitting is incompletely inserted in the terminal accommodating chamber, when the connector B is fitted into the connector support 3 as shown in FIG. 5 (ii), the connector engaging pins 9 which have moved into the rear sections 14a of the receiving holes 14 are in the position to engage with the engaging shoulders 15a of the incompletely inserted terminal fitting C as shown in FIG. 6 (i). When the inspection device body 4 and the connector support 3 are moved as shown in FIG. 5 (iv), the fixed connector engaging pins relatively change their positions to move the incompletely inserted terminal fitting C to the back of the terminal accommodating chamber 13 as shown in FIG. 6 (ii) and stop it in captive state as well known.

EXAMPLE 2

Figure 7:
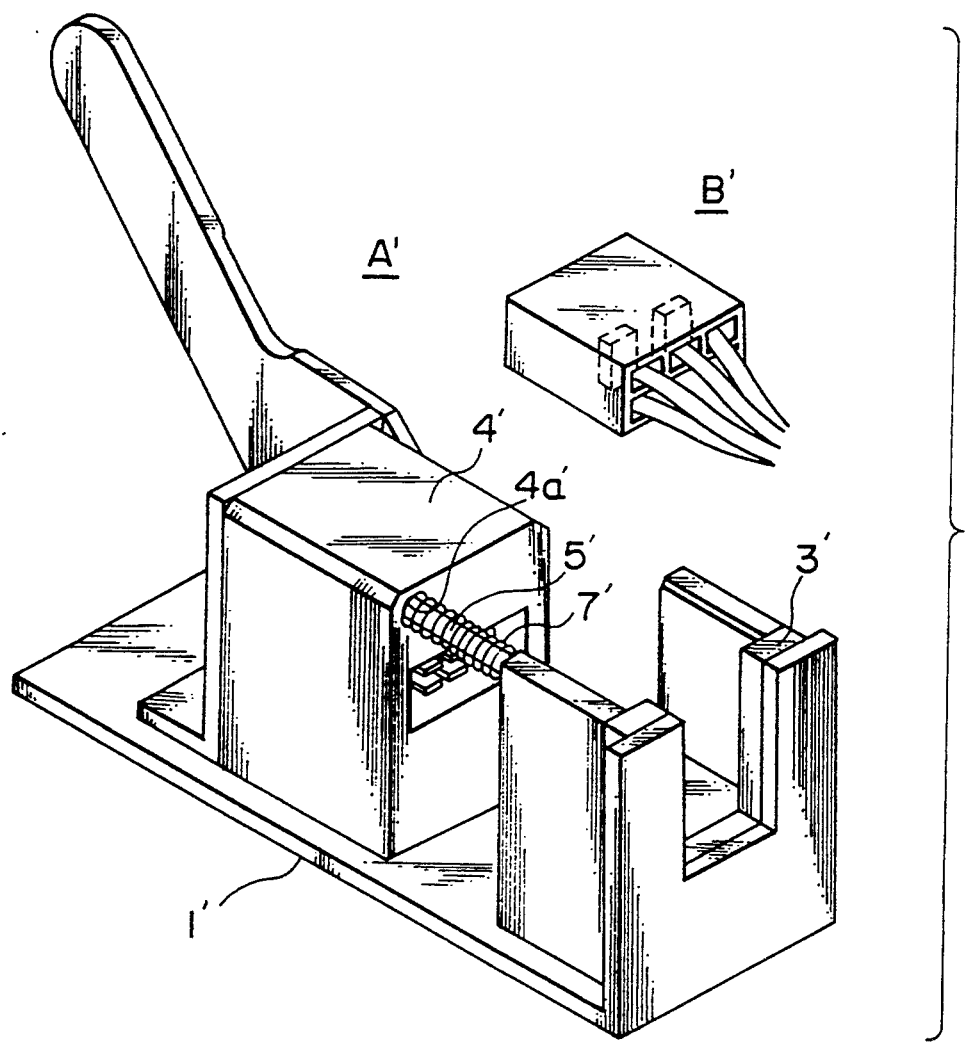
FIG. 7 is a perspective view showing the inspection device and the connector to be inspected in Example 2 of this invention.
Figure 8:
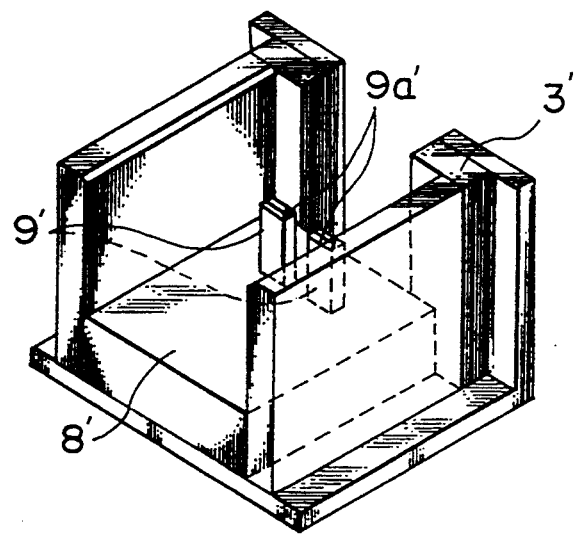
FIG. 8 is a perspective view showing the connector support of the inspection device in Example 2 of this invention.

FIG. 7 shows the inspection device of another example of this invention. A connector support 3' whose top and front and rear are open is fixed at one end of a base 1' of a terminal inspection device A' and an inspection device body 4' is disposed to be movable in the back and forth directions. To the connector support 3', a movement guide rod 5' is fixed to extend into a hole 4a' of the inspection device body 4' and the inspection device body 4' is energized backward by means of a spring 7' which is wound on the movement guide rod 5'. A connector receiver 8' shown in FIG. 8 is fixed to the connector support 3' and two connector engaging pins 9' are erected on the connector receiver 8'. The connector engaging pins 9' have tapered leading ends 9a' to make the engagement with a terminal fitting easier.

Figure 9:
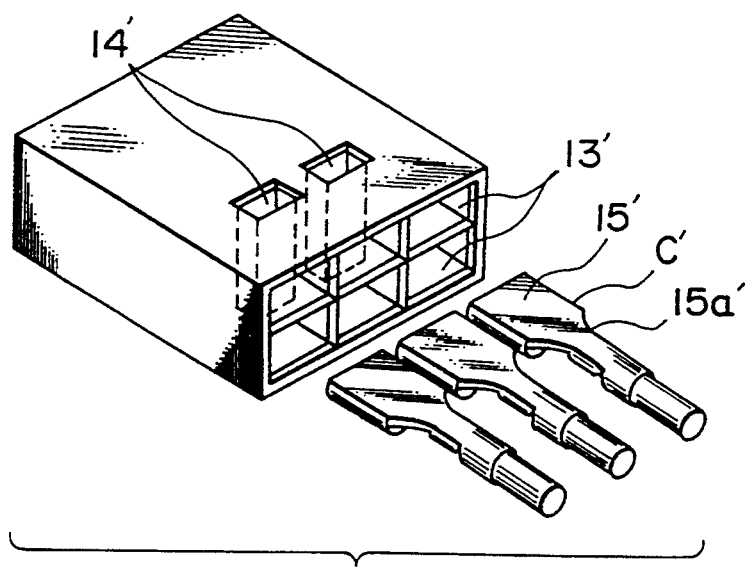
FIG. 9 is a perspective view showing the connector housing and the terminal fittings in Example 2 of this invention.
Figure 10A:
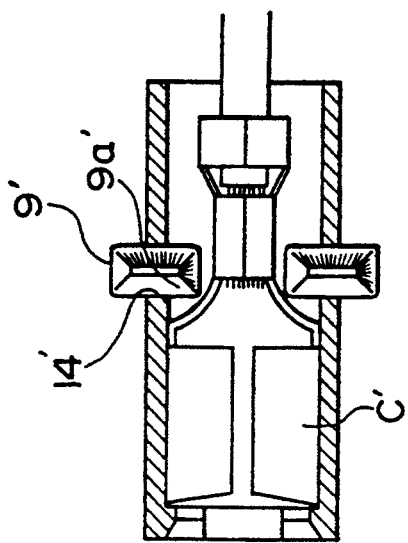
FIGS. 10A-10D includes plan views showing the relation between the connector engaging pins and the terminal fitting in Example 2 of this invention.
Figure 10C:
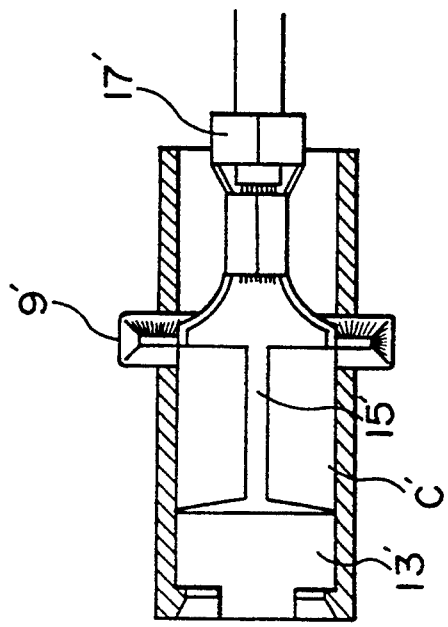
Figure 10B:
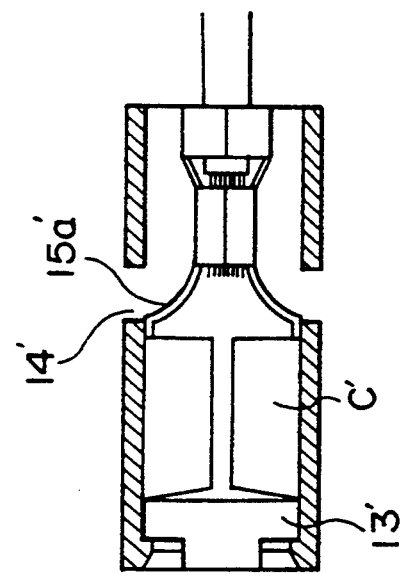
Figure 10D:
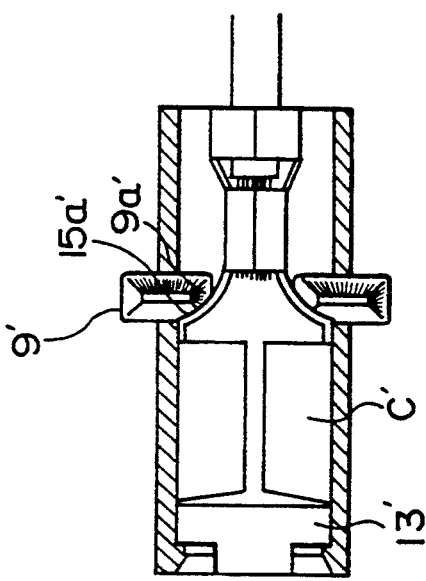

FIG. 9 shows a connector to be inspected used in this example. A connector housing B2 has six terminal accommodating chambers 13' which are arranged in three rows wide and two steps vertical, and two connector engaging pin receiving holes 14' which substantially meet the connector engaging pins 9' of FIG. 8 are formed to range from the bottom to the top of the terminal accommodating chamber 13'. Terminal fittings C' have the same structure with those of EXAMPLE 1 and tapered engaging shoulders 15a' are formed at the rear end of a female electric contact 15'.

FIG. 10 includes plan views showing the positions of a terminal fitting in one terminal accommodating chamber of the connector housing. (i) shows a state that the terminal fitting C' is incompletely inserted into the terminal accommodating chamber 13'. The tapered engaging shoulders 15a' of the terminal fitting are positioned in the connector engaging pin receiving holes 14'. When the connector under the above state is fitted into the connector support, the tapered leading ends 9a' of the connector engaging pins move into the connector engaging pin receiving holes 14' to contact with the tapered engaging shoulders 15a' of the terminal fitting as shown in (ii), and advance the incompletely inserted terminal fitting to the completely inserted position in the moving process of the connector engaging pins as shown in (iii).

As shown in (iv), if the terminal fitting C' is in the state that the electric contact 17 of the terminal fitting C' projects out of the rear end of the terminal accommodating chamber 13', when the connector is tried to be fitted into the connector support, the tapered leading ends 9a' of the connector engaging pins contact with the female electric contact 15' of the terminal fitting, resulting in failure of fitting. Thus, the incompletely inserted terminal fitting of the connector can be detected.

As described above, the present invention fixes the connector engaging pins which go into the connector to be inspected to the connector support of the connector terminal inspection device, so that the incompletely inserted terminal fitting is detected when inspecting conductivity of the connector terminal fitting, and the incompletely inserted terminal fitting is forced to move into the completely inserted state, thereby making it possible to prevent the terminal fitting from coming off.

While the invention has been described in detail and with reference to specific embodiments thereof, it will be apparent to one skilled in the art that various changes and modifications can be made therein without departing from the spirit and scope thereof.

What is claimed is:

1. A connector terminal inspection device comprising a support for a connector to be inspected and an inspection device body being disposed to be freely movable with respect to a base, said connector support being energized by means of a spring in the direction of said inspection device body, connector engaging pins being fixed to the base side within said connector support to go into the connector to be inspected, a plurality of inspection pins being disposed in a row within said inspection device body with their leading ends projected, said connector support and said connector to be inspected being moved by the movement of said inspection device body for the inspection, said inspection pins being moved back as contacted with the terminal fitting of said connector to flow electricity through a circuit within said inspection device body, and said connector engaging pins causing an incompletely inserted terminal fitting to move in a completely inserted position in said connector as the connector moves.

2. The connector terminal inspection device according to claim 1, wherein said connector engaging pins have tapered leading ends.

3. A connector terminal inspection device comprising a support for a connector to be inspected being fixed to a base, an inspection device body being disposed to be freely movable with respect to the base, connector engaging pins being disposed in said connector support to go into the connector to be inspected, a plurality of inspection pins being disposed in a row within said inspection device body with their leading ends projected, said connector engaging pins detecting an incompletely inserted terminal fitting when said connector to be inspected is fitted into said connector support, and said inspection pins being moved backward as contacted with a terminal fitting completely inserted into said connector by the movement of said inspection device body for the inspection to flow electricity through a circuit within said inspection device body.

4. The connector terminal inspection device according to claim 2, wherein said connector engaging pins have tapered leading ends.

5. A connector terminal inspection device comprising a support for a connector to be inspected being fixed to a base, an inspection device body being disposed to be freely movable with respect to the base, a plurality of inspection pins being disposed in a row within said inspection device body with their leading ends projected, connector engaging pins being disposed in said connector support to go into the connector to be inspected, said connector engaging pins having tapered leading ends, a terminal fitting in said connector having tapered engaging shoulders formed integrally with an electrical contact section at the rear end of the electrical contact section, said tapered leading ends of the connector engaging pins being contacted with the tapered engaging shoulders of the terminal fitting when the connector to be inspected is fitted into said connector support, said terminal fitting being advanced to a completely inserted position in the connector in the process that the connector engaging pins go into the connector, and said inspection pins being moved backward as contacted with the terminal fitting of said connector by the movement of said inspection device body for the inspection to flow electricity through a circuit within said inspection device body.

6. A connector terminal inspection method comprising disposing a support for a connector to be inspected and an inspection device body to be freely movable with respect to a base, energizing said connector support in the direction of said inspection device body by means of a spring, fixing connector engaging pins which go into the connector to be inspected to the base side within said connector support, disposing a plurality of inspection pins in a row within said inspection device body with their respective leading ends projected, fitting said connector into said connector support with said connector engaging pins moved into the connector, moving said inspection device body under that state so as to move said connector support which is energized in the direction of said inspection device body and the connector to be inspected and also contacting the inspection pins with the terminal fitting of said connector to move backward to pass electricity through a circuit within said inspection device body, and moving the terminal fitting in the incompletely inserted state into a completely inserted position in the connector by means of said connector engaging pins in the moving process of said connector.

7. A connector terminal inspection method comprising fixing a support for a connector to be inspected to a base, disposing an inspection device body to be freely movable with respect to the base, disposing connector engaging pins in said connector support to go into the connector to be inspected, disposing a plurality of inspection pins in a row within said inspection device body with their leading ends projected, judging whether said connector engaging pins can move into said connector to be inspected when said connector is fitted into said connector support, if said connector engaging pins can be moved into said connector, moving said inspection device body to contact said inspection pins with the terminal fitting of said connector and to move said inspection pins backward under that state so as to pass electricity through a circuit within said inspection device body, and if said connector engaging pins cannot move into said connector, thereby detecting the presence of a terminal fitting which is not completely inserted in the connector.

8. A connector terminal inspection method comprising fixing a support for a connector to be inspected to a base, disposing an inspection device body to be freely movable with respect to the base, disposing connector engaging pins within said connector support to move into said connector to be inspected, disposing a plurality of inspection pins in a row within said inspection device body with their leading ends projected, fitting said connector into said connector support and also moving said connector engaging pins into the connector, advancing a terminal fitting fitted in said connector to the completely inserted position by means of said connector engaging pins in the above moving process, moving said inspection device body to contact said inspection pins with said connector terminal fitting and to move said inspection pins backward, thereby passing electricity through a circuit within said inspection device body.

9. The connector terminal inspection method according to claim 6, wherein a connector housing for said connector has a plurality of terminal accommodating chambers disposed in a row to receive said terminal fitting and connector engaging pin receiving holes formed along said terminal accommodating chambers adjacent to each other.

10. The connector terminal inspection method according to claim 7, wherein a connector housing for said connector has a plurality of terminal accommodating chambers disposed in a row to receive said terminal fitting and connector engaging pin receiving holes formed along said terminal accommodating chambers adjacent to each other.

11. The connector terminal inspection method according to claim 8, wherein a connector housing for said connector has a plurality of terminal accommodating chambers disposed in a row to receive said terminal fitting and connector engaging pin receiving holes formed along said terminal accommodating chambers adjacent to each other.

12. The connector terminal inspection method according to claim 6, wherein a connector housing for said connector has a plurality of terminal accommodating chambers which are arranged in N rows in the horizontal direction and in multiple steps in the vertical direction and has connector engaging pin receiving holes formed in the number of (N−1) ranging from the bottom of said connector housing to the terminal accommodating chambers in multiple steps in the vertical direction and over the terminal accommodating chambers adjacent in the horizontal direction.

13. The connector terminal inspection method according to claim 7, wherein a connector housing for said connector has a plurality of terminal accommodating chambers which are arranged in N rows in the horizontal direction and in multiple steps in the vertical direction and has connector engaging pin receiving holes formed in the number of (N−1) ranging from the bottom of said connector housing to the terminal accommodating chambers in multiple steps in the vertical direction and over the terminal accommodating chambers adjacent in the horizontal direction.

14. The connector terminal inspection method according to claim 8, wherein a connector housing for said connector has a plurality of terminal accommodating chambers which are arranged in N rows in the horizontal direction and in multiple steps in the vertical direction and has connector engaging pin receiving holes formed in the number of (N−1) ranging from the bottom of said connector housing to the terminal accommodating chambers in multiple steps in the vertical direction and over the terminal accommodating chambers adjacent in the horizontal direction.

15. The connector terminal inspection method according to claim 6, wherein said connector engaging pins have tapered leading ends, and said terminal fitting to be fitted in said connector has tapered engaging shoulders formed integrally with an electrical contact section at the rear end of the electrical contact section to contact said tapered leading ends with said tapered engaging shoulders.

16. The connector terminal inspection method according to claim 7, wherein said connector engaging pins have tapered leading ends, and said terminal fitting to be fitted in said connector has tapered engaging shoulders formed integrally with an electrical contact section at the rear end of the electrical contact section to contact said tapered leading ends with said tapered engaging shoulders.

17. The connector terminal inspection method according to claim 8, wherein said connector engaging pins have tapered leading ends, and said terminal fitting to be fitted in said connector has tapered engaging shoulders formed integrally with an electrical contact section at the rear end of the electrical contact section to contact said tapered leading ends with said tapering engaging shoulders.

18. The connected terminal inspection method according to claim 9, wherein said connector engaging pins have tapered leading ends, and said terminal fitting to be fitted in said connector has tapered engaging shoulders formed integrally with an electrical contact section at the rear end of the electrical contact section to contact said tapered leading ends with said tapered engaging shoulders.

19. The connector terminal inspection method according to claim 10, wherein said connector engaging pins have tapered leading ends, and said terminal fitting to be fitted in said connector has tapered engaging shoulders formed integrally with an electrical contact section at the rear end of the electrical contact section to contact said tapered leading ends with said tapered engaging shoulders.

20. The connector terminal inspection method according to claim 11, wherein said connector engaging pins have tapered leading ends, and said terminal fitting to be fitted in said connector has tapered engaging shoulders formed integrally with an electrical contact section at the rear end of the electrical contact section to contact said tapered leading ends with said tapered engaging shoulders.

21. The connector terminal inspection method according to claim 12, wherein said connector engaging pins have tapered leading ends, and said terminal fitting to be fitted in said connector has tapered engaging shoulders formed integrally with an electrical contact section at the rear end of the electrical contact section to contact said tapered leading ends with said tapered engaging shoulders.

22. The connector terminal inspection method according to claim 13, wherein said connector engaging pins have tapered leading ends, and said terminal fitting to be fitted in said connector has tapered engaging shoulders formed integrally with an electrical contact section at the rear end of the electrical contact section to contact said tapered leading ends with said tapered engaging shoulders.

23. The connector terminal inspection method according to claim 14, wherein said connector engaging pins have tapered leading ends, and said terminal fitting to be fitted in said connector has tapered engaging shoulders formed integrally with an electrical contact section at the rear end of the electrical contact section to contact said tapered leading ends with said tapered engaging shoulders.

24. The connector terminal inspection method according to claim 6 further comprising forming receiving holes in a connector housing for said connector to receive said connector engaging pins, positioning said connector engaging pins at the rear sections of said receiving holes when fitting said connector into said connector support, moving said inspection device body under that state so as to move said connector support which is energized in the direction of said inspection device body and the connector to be inspected and also contacting the inspection pins with the terminal fitting of said connector to move backward to pass electricity through a circuit within said inspection device body, relatively moving said connector engaging pins to the front sections of said receiving holes in the moving process of said connector, and moving an incompletely inserted terminal fitting into a completely inserted position in the connector by the relative movement of said connector engaging pins from the rear section to the front sections of said receiving holes.

* * * * *